(12) United States Patent
Roodnat

(10) Patent No.: US 6,646,321 B2
(45) Date of Patent: Nov. 11, 2003

(54) POWER TRANSISTOR WITH INTERNALLY COMBINED LOW-PASS AND BAND-PASS MATCHING STAGES

(75) Inventor: Anton Willem Roodnat, Leiden (NL)

(73) Assignee: Koninklijke Philips Electronics N.V., Eindhoven (NL)

( * ) Notice: Subject to any disclaimer, the term of this patent is extended or adjusted under 35 U.S.C. 154(b) by 0 days.

(21) Appl. No.: 10/047,030

(22) Filed: Jan. 15, 2002

(65) Prior Publication Data

US 2002/0109203 A1 Aug. 15, 2002

(30) Foreign Application Priority Data

Jan. 18, 2001 (EP) .............................. 01200168

(51) Int. Cl.$^7$ .............................................. H01L 29/00
(52) U.S. Cl. .................... 257/516; 257/341; 257/277; 257/531; 257/532; 257/379
(58) Field of Search ................... 257/341, 277, 257/361, 379, 516, 531–533, 536, 577, 728; 330/300, 307; 333/247

(56) References Cited

U.S. PATENT DOCUMENTS

| | | | | | |
|---|---|---|---|---|---|
| 3,969,752 | A | * | 7/1976 | Martin et al. | 257/531 |
| 4,168,507 | A | * | 9/1979 | Yester, Jr. | 257/531 |
| 5,315,156 | A | * | 5/1994 | Lott | 257/728 |
| 5,371,405 | A | * | 12/1994 | Kagawa | 257/664 |
| 5,465,007 | A | * | 11/1995 | Ikeda et al. | 257/584 |
| 5,635,751 | A | * | 6/1997 | Ikeda et al. | 257/584 |
| 5,880,517 | A | * | 3/1999 | Petrosky | 257/577 |
| 6,087,721 | A | * | 7/2000 | Akhnoukh et al. | 257/705 |
| 6,181,200 | B1 | * | 1/2001 | Titizian et al. | 330/66 |
| 6,194,774 | B1 | * | 2/2001 | Cheon | 257/531 |
| 6,396,342 | B1 | * | 5/2002 | Takenaka | 330/65 |

* cited by examiner

Primary Examiner—David Nelms
Assistant Examiner—Andy Huynh
(74) Attorney, Agent, or Firm—Steven R. Biren

(57) ABSTRACT

RF power transistor provided with an internal shunt inductor, characterized in that the shunt is produced in two separated, capacitors (Cb, Cp), each internally bonded to the transistor internal active die (AD) through internal leads (Li, Ld1), one of which capacitors (Cp) being connected to the transistor lead (L) by a further bond wire (Ld).

7 Claims, 1 Drawing Sheet

POWER TRANSISTOR WITH INTERNALLY COMBINED LOW-PASS AND BAND-PASS MATCHING STAGES

BACKGROUND OF THE INVENTION

The present invention relates to a high frequency power transistor provided with an internal shunt inductor.

Such power transistors are generally known. They are commonly provided with a post-matching stage formed by the internal shunt inductor. Such transistors have since long been utilised satisfactorily, however, as a basic electric component are continuously sought to be optimized and improved in performance.

SUMMARY OF THE INVENTION

According to the invention, such may surprisingly be realised by a relatively simple and highly cost efficient measure, according to which the shunt capacitor is produced in two separated capacities, each internally bonded to the transistor internal active die through internal leads, one of which capacities being connected to the transistor lead by a further bond wire.

By this measure, which may readily be applied at the manufacture of such transistors the output impedance is strongly increased, e.g. from about 2Ω to about 19Ω for a 30 W device at 2 GHz, which means that by appropriate choice of the internal wires the output impedance may relatively easy be adapted to customer requirements, while technically less circuit losses will occur.

The invention particularly is advantageous in, and therefore also relates to a parallel arrangement of a plurality of transistors at a high ohmic level. In such a circuitry scaling problems occur only to a lower extend, resulting in improved efficiency, gain and output power of any up-scaled device.

Surprisingly, also a quality improvement of the transistor is achieved by the present invention, since the internal lead wire between the transistor active die and the transistor lead, and the internal bandpass wire between the blocking capacitor and the active die, in the new arrangement have a greater distance, leading to a lower chance of mutual coupling so that the functioning of the inshin is improved. A particular advantage of the present improvement is that it can be implemented at virtually no cost.

BRIEF DESCRIPTION OF THE DRAWINGS

The invention will now be further elucidated by way of a drawing in which:

FIG. 3 is a representation according to FIG. 1 of the post-matching scheme of the transistor according to the invention, while

In the Figures corresponding components are referred to with identical references.

DESCRIPTION OF THE PREFERRED EMBODIMENTS

Figure 1:
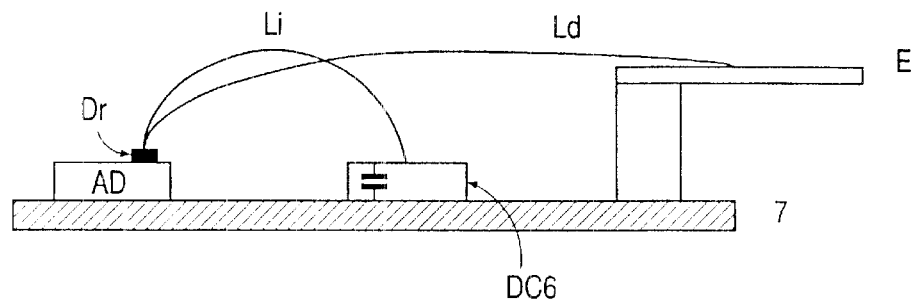
FIG. 1 is a schematic representation of a relevant part of a state of the art transistor.

In FIG. 1 an active die AD is fixed to a transistor flange part 7 and likewise a DC block DC6. The active die AD is provided with a drain Dr, via which it is bond wired on the one hand by a wire Ld to a transistor lead E and on the other hand, by wire Li to the DC block DCb.

Figure 2:
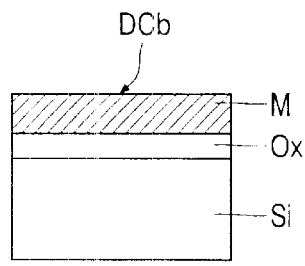
FIG. 2 represents a virtual section of the DC blocking capacitor of FIG. 1, showing the layer built-up of the block.

FIG. 2, in horizontal section thereof shows the layer built-up of the MOS capacitor by which the DC block DCb is formed. It comprises a lower silicicon layer Si, an intermediate dielectricum layer Ox and an upper metal layer M. The lead Li forms a bandpass impedance transformation intended to resonate with the output capacitor of the power transistor at the lower side of the desired frequency range for the transistor.

Figure 4:
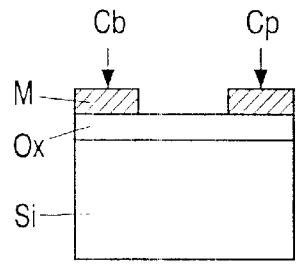
FIG. 4 is a representation in accordance with FIG. 2 of the capacitor block according to the invention.

In the new arrangement according to the invention, as represented by FIG. 4, the conventional MOS capacitor is transformed into a MOS capacitor having two mutually separated metal layers on top of the intermediate dielectricum layer Ox.

Figure 3:
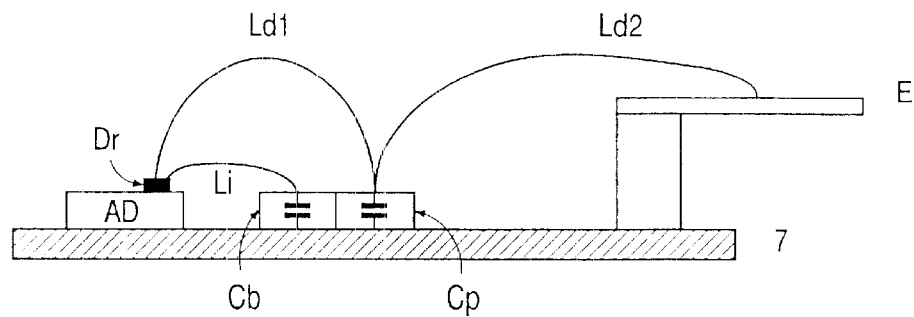

According to the invention two capacitors may in this way be produced with a single crystal, by which favourably the implementation according to FIG. 3 is realised, in which the bandpass lead Li is connected between the active die and a first capacitor Cl, forming a blocking capacitor for the new arrangement, whereas active die AD on the other hand by wire Ld1 is connected to the other capacitor Cp, used as a post-matching capacitor, which in turn is connected to the transistor lead E by bond wire Ld2.

The above, surprisingly simple arrangement of the transistor components may readily be put into practice by any one active in the art. The arrangement favourably achieves a double internal post-matching of a power transistor by combining a lowpass and a bandpass matching stage, utilising a single capacity crystal.

The split up of the DC block capacity of the engine into two capacitors and the slightly different bonding within the transistor thus realises an extra impedance transformation through which RE (sold) may be increased at customers wish up to a significantly higher level, in practise the RE of conventional RF transistors may be increased by a factor up to 8 times, all virtually without additional manufacturing efforts.

The invention apart from the preceding description and all details of the pertaining Figures, further relates to the features of the following claims.

What is claimed is:

1. RF power transistor provided with an internal shunt inductor characterized in that the shunt is produced in two separate but parallel-connected capacitors (Cb, Cp), each internally bonded to the transistor internal active die (AD) through internal leads (Li, Ld1), one of which capactors (Cp) being connected to the transistor lead (E) by a further bond wire (Ld2).

2. The transistor according to claim 1, characterized in that the capacitors are MOS capacitors.

3. The transistor according to claim 1, characterized in that the internal leads (Ldi, Ld1) are formed by mutually separated bond wires.

4. The transistor according to claim 1, characterized to the capacitors (Cb, Cp) are formed by a metal layer being produced as a two part split of the metal layer of a common DC block capacity of the internal shunt.

5. The transistor according to claim 1 characterized in that the two separated capacitors are implemented for creating an additional impedance transformation.

6. The transistor according to any of the preceding claims, characterized in that an output impedance is larger than 10Ω.

7. An electric circuit comprising a transistor according to any of the preceding claims characterized in that the transistors are incorporated in parallel connection at a relatively high ohmic resistance.

* * * * *